United States Patent
Ghoshal et al.

(10) Patent No.: US 10,894,302 B2
(45) Date of Patent: Jan. 19, 2021

(54) MULTILAYERED METAL NANO AND MICRON PARTICLES

(71) Applicant: ALPHA ASSEMBLY SOLUTIONS INC., Somerset, NJ (US)

(72) Inventors: Shamik Ghoshal, South Plainfield, NJ (US); Remya Chandran, South Plainfield, NJ (US); Sutapa Mukherjee, South Plainfield, NJ (US); Siuli Sarkar, South Plainfield, NJ (US); Ranjit Pandher, South Plainfield, NJ (US); Bawa Singh, South Plainfield, NJ (US)

(73) Assignee: Alpha Assembly Solutions Inc., Somerset, NJ (US)

( * ) Notice: Subject to any disclaimer, the term of this patent is extended or adjusted under 35 U.S.C. 154(b) by 598 days.

(21) Appl. No.: 15/318,895

(22) PCT Filed: Jun. 22, 2015

(86) PCT No.: PCT/GB2015/051805
§ 371 (c)(1),
(2) Date: Dec. 14, 2016

(87) PCT Pub. No.: WO2015/198022
PCT Pub. Date: Dec. 30, 2015

(65) Prior Publication Data
US 2017/0113306 A1 Apr. 27, 2017

Related U.S. Application Data

(60) Provisional application No. 62/015,845, filed on Jun. 23, 2014.

(51) Int. Cl.
*B23K 35/02* (2006.01)
*B23K 35/30* (2006.01)
(Continued)

(52) U.S. Cl.
CPC .......... *B23K 35/302* (2013.01); *B22F 1/0014* (2013.01); *B22F 1/0018* (2013.01);
(Continued)

(58) Field of Classification Search
CPC .............. B23K 35/3006; B23K 35/302; B23K 35/3013; B23K 35/322; B23K 35/025;
(Continued)

(56) References Cited

U.S. PATENT DOCUMENTS 6,358,611 B1 * 3/2002 Nagasawa ............. B22F 1/0018
419/23
7,259,320 B2 * 8/2007 Take ...................... B22F 1/025
136/236.1
(Continued)

FOREIGN PATENT DOCUMENTS

| CN | 103752842 | 4/2014 |
|---|---|---|
| JP | 2009-158273 | 7/2009 |

(Continued)

OTHER PUBLICATIONS

Kim, S.J. et al., "Fabrication of Conductive Interconnects by AG Migration in Cu—Ag Core-Shell Nanoparticles," Applied Physics Letters, vol. 96, No. 14, pp. 144101-1-144101-3 (Apr. 2010).

*Primary Examiner* — Cam N. Nguyen
(74) *Attorney, Agent, or Firm* — Stinson LLP

(57) ABSTRACT

A sintering powder, wherein a least a portion of the particles making up the sintering powder comprise: a core comprising a first material; and a shell at least partially coating the core, the shell comprising a second material having a lower oxidation potential than the first material.

15 Claims, 12 Drawing Sheets

(51) Int. Cl.
*B23K 35/32* (2006.01)
*B23K 35/36* (2006.01)
*B22F 1/00* (2006.01)
*B22F 1/02* (2006.01)
*B22F 9/24* (2006.01)
*C09C 1/62* (2006.01)

(52) U.S. Cl.
CPC .......... *B22F 1/0022* (2013.01); *B22F 1/0059* (2013.01); *B22F 1/0074* (2013.01); *B22F 1/025* (2013.01); *B22F 9/24* (2013.01); *B23K 35/025* (2013.01); *B23K 35/3601* (2013.01); *B23K 35/3613* (2013.01); *C09C 1/62* (2013.01); *B22F 2001/0066* (2013.01); *B22F 2009/245* (2013.01); *B22F 2301/10* (2013.01); *B22F 2301/255* (2013.01); *B22F 2998/10* (2013.01); *C01P 2002/22* (2013.01); *C01P 2002/72* (2013.01); *C01P 2004/84* (2013.01)

(58) Field of Classification Search
CPC ............ B23K 35/3601; B23K 35/3613; B22F 1/0014; B22F 1/0018; B22F 1/0022; B22F 1/0059; B22F 1/0074; B22F 1/025; B22F 9/24
See application file for complete search history.

(56) References Cited

U.S. PATENT DOCUMENTS

| | | | | |
|---|---|---|---|---|
| 7,288,325 B2 * | 10/2007 | Eklund | ................ | B22F 1/0018 428/402 |
| 7,722,953 B2 * | 5/2010 | Korgel | ................... | B82Y 10/00 428/403 |
| 7,968,008 B2 * | 6/2011 | Parashar | ............... | B22F 1/0018 252/500 |
| 8,163,633 B2 * | 4/2012 | Korgel | ............ | H01L 29/42332 257/E21.085 |
| 8,282,860 B2 * | 10/2012 | Chung | ...................... | B22F 9/24 106/1.19 |
| 8,491,998 B2 * | 7/2013 | Komatsu | .............. | B22F 1/0018 428/323 |
| 8,497,022 B2 * | 7/2013 | Komatsu | .............. | B23K 35/025 156/326 |
| 8,772,197 B2 * | 7/2014 | Hatton | ................... | A01N 25/24 502/401 |
| 9,217,088 B2 * | 12/2015 | Parashar | ............... | B22F 1/0018 |
| 9,378,861 B2 * | 6/2016 | Zinn | .................... | B22F 1/0018 |
| 9,428,680 B2 * | 8/2016 | Zambova | ................ | C08L 83/04 |
| 9,520,205 B2 * | 12/2016 | Shin | ......................... | B22F 9/24 |
| 9,533,286 B2 * | 1/2017 | Stamm Masias | ........ | B01J 23/63 |
| 9,833,836 B2 * | 12/2017 | Magdassi | ................ | B01J 13/02 |
| 9,944,667 B2 * | 4/2018 | Wan | ...................... | C07F 9/3813 |
| 10,006,105 B2 * | 6/2018 | Maekawa | ................ | B22F 9/24 |
| 10,056,505 B2 * | 8/2018 | Rantala | .................. | C09D 11/52 |
| 2008/0203914 A1 | 8/2008 | Cho et al. | | |
| 2011/0290863 A1 | 12/2011 | Kajiwara et al. | | |
| 2012/0153011 A1 | 6/2012 | Schafer et al. | | |
| 2013/0089812 A1 * | 4/2013 | Mukerjee | ............... | B82Y 30/00 429/524 |
| 2015/0217374 A1 | 8/2015 | Kim et al. | | |
| 2015/0262729 A1 | 9/2015 | Aoki et al. | | |

FOREIGN PATENT DOCUMENTS

| | | |
|---|---|---|
| JP | 2013-504148 | 2/2013 |
| KR | 10-2008-0078396 | 8/2008 |
| KR | 10-2010-0054281 | 5/2010 |
| KR | 10-2014-0027624 | 3/2014 |
| WO | 2014/068299 | 5/2014 |
| WO | 2014/084021 A1 | 6/2014 |

* cited by examiner

MULTILAYERED METAL NANO AND MICRON PARTICLES

FIELD OF THE INVENTION

The invention relates to a sintering powder and a method of making the same.

BACKGROUND OF THE INVENTION

The demand for alternative lead-free die attach materials with high electrical and thermal requirements is on the rise in today's era. Highly conductive epoxies and conventional lead base solder paste are still widely used in many of the applications. But the main drawback of these materials is their limitation in high temperature operation, which results in solder joint fatigue and reliability problems like intermetallic compound growth.

Nano-structured metals are being researched extensively as an alternative for many semiconductor interconnection challenges. Metallic nanoparticles have been widely investigated in recent years because they possess interesting properties that differ significantly from those of bulk materials. Nanoparticles have high surface energy which enables them to undergo particle coalescence at a much lower processing temperature as compared to the bulk materials. A sintering temperature well below the melting point for nanoscale metals is of great advantage for semiconductor packaging. Processing the devices at low temperature could avoid initial die level stresses and potential circuit damages.

Nanoparticles of several elements including gold, palladium, silver and copper have been well-studied due to their potential applications as conducting materials in the optoelectronic or semiconductor fields. Noble metal nanoparticles such as silver and gold, because of their high thermal conductivity and excellent non-oxidizing properties, have been so far the most active research objects in the past years. However, their high cost prevents them from widespread practical applications. So the usage of non-noble metal nanoparticle with decent thermal stability and conductivity is of great interest in today's electronic world. Copper nanoparticles, due to their relatively low cost and high electrical conductivity, exhibit high potential for replacing the noble metal nanoparticles used in conductive materials. A major problem in utilizing copper nanoparticles is their inherent tendency to oxidize in ambient conditions.

In the electronics industry, semiconductor device interconnection to the substrate is an important part of device packaging. The main materials currently used for the die attachment and interconnections are the low melting solders, which are not ideal because of the low operating temperature.

Silver paste is commonly used in microelectronic packages due to silver's high electrical and thermal performance. However, the high cost of silver limits its usage.

The present invention seeks to tackle at least some of the problems associated with the prior art or at least to provide a commercially acceptable alternative solution thereto.

SUMMARY OF THE INVENTION

In a first aspect, the present invention provides a sintering powder, wherein a least a portion of the particles making up the sintering powder comprise:

a core comprising a first material; and
a shell at least partially coating the core, the shell comprising a second material having a lower oxidation potential than the first material.

Each aspect or embodiment as defined herein may be combined with any other aspect(s) or embodiment(s) unless clearly indicated to the contrary. In particular, any features indicated as being preferred or advantageous may be combined with any other feature indicated as being preferred or advantageous.

BRIEF DESCRIPTION OF THE DRAWINGS

The invention will now be further described with reference to the following non-limiting Figures, in which.

DETAILED DESCRIPTION OF THE PREFERRED EMBODIMENTS

Figure 1:
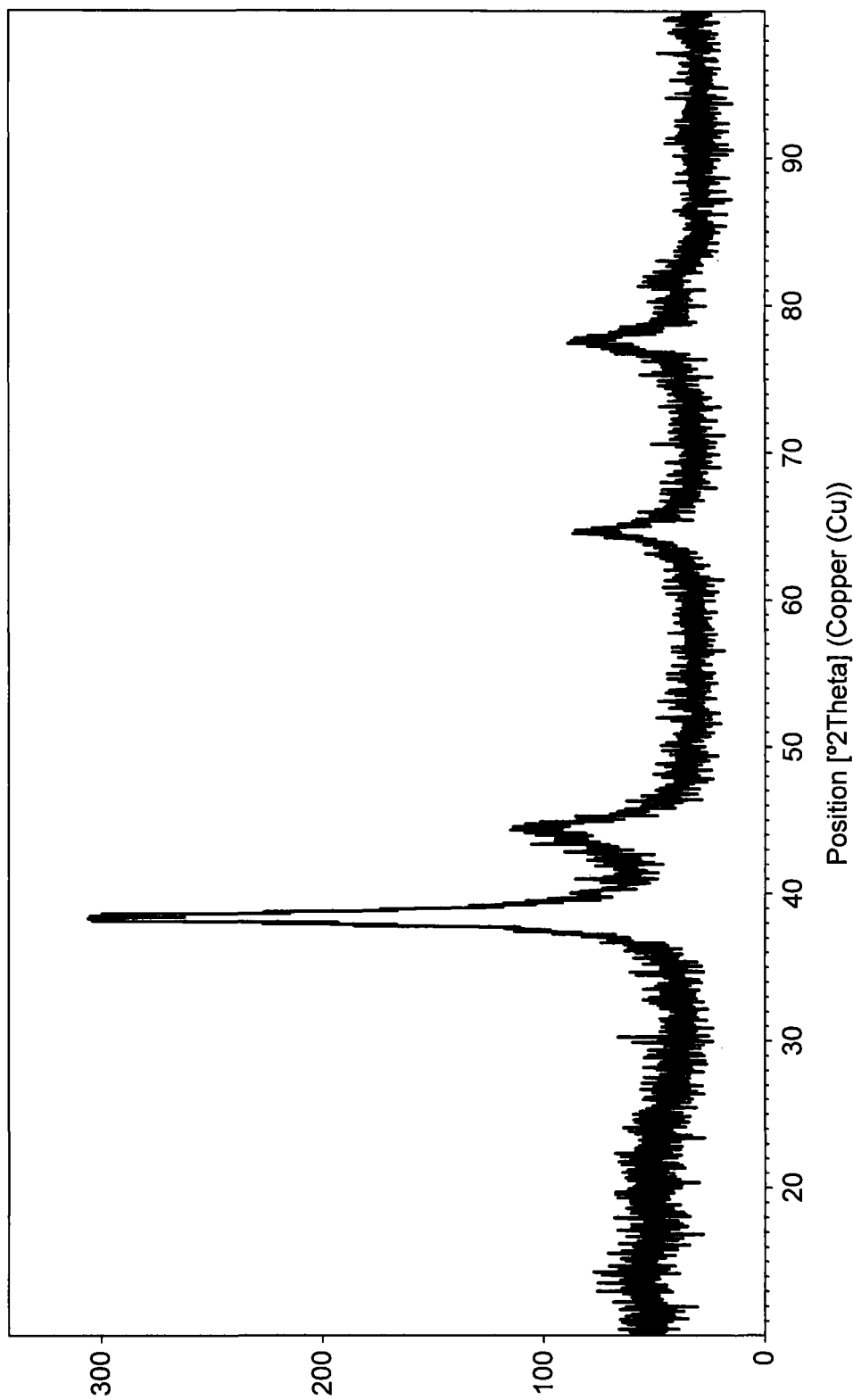
FIG. 1 shows a powder X-ray diffraction (XRD) pattern of the sintering powder of Example 1.

The term "sintering powder" as used herein may encompass a powder capable of forming a sintered joint. Sintered joints are formed by atomic diffusion of metal particles placed between two work pieces to be joined. The sintering powder may comprise regular shaped particles (such as, for example, spheres) or irregular shaped particles (such as, for example, whiskers, plates, rods or flakes).

The term "capping agent" as used herein may encompass a species that, when present on the surface of metal particles, reduces agglomeration of the metal particles, enables particle size control during powder production and reduces particles' surface oxidation or other contamination.

The term "metal" as used herein may encompass an alloy.

The term "D95" as used herein may encompass the value of the longest particle dimension at 95% in the cumulative distribution. When the particles are spheres, the longest dimension will be the diameter of the sphere. D95 values may be determined by a dynamic light scattering method or a laser scattering method.

The term "D50" as used herein may encompass the value of the longest particle dimension at 50% in the cumulative distribution. When the particles are spheres, the longest dimension will be the diameter of the sphere. D50 values may be determined by a dynamic light scattering method or a laser scattering method.

The inventors have surprisingly found that, in comparison to sintering powders of the prior art, the sintering powder of the present invention may exhibit high electrical and thermal conductivity, and low susceptibility of surface oxidation.

The sintering powders may also contain low cost materials, thereby reducing their manufacturing costs.

The first material may exhibit high electrical and thermal conductivity. The first material typically exhibits a thermal conductivity of great than $5 \times 10^6$ S/cm at 20° C., more typically greater than $5 \times 10^7$ S/cm at 20° C. Accordingly, such high conductivities may be transferred to a sintered joint formed using the sintering powder.

The first material may be a metal or a non-metal. The first material, which typically makes up the majority of the sintering powder, may be a low cost material such as, for example, copper. Accordingly, the cost of manufacturing the sintering powder may be reduced.

Advantageously, the second material has a lower oxidation potential than the first material. Accordingly, the shell may serve to reduce oxidation of the first material, thereby avoiding degradation of the sintering powder. Preferably, the oxidation potential of the second material is at least 0.2 V less than that of the first material, more preferably at least 0.5 V less than that of the first material. The first material typically has an oxidation potential of greater than −0.4 V, preferably greater than −0.2 V. The second material typically has an oxidation potential less than −0.5 V, preferably less than −0.7 V.

The second material may be a metal or a non-metal. Typically, the second material is a noble metal.

The second material typically makes up only a small part of the sintering powder, typically less than 50 wt. % of the sintering powder, more typically less than 25 wt. % of the sintering powder. As a result, even though if the second material is high cost (e.g. a noble metal such as, for example, silver) the sintering powder may exhibit reduced degradation without significantly increasing the manufacturing costs thereof.

At least a portion of the particles making up the sintering powder have the above-described "core-shell" structure. Preferably, the majority of the particles making up the sintering powder have the core-shell structure, more preferably substantially all of the particles making up the sintering powder have the core-shell structure. In some preferred embodiments, the sintering powder is substantially free of particles formed of the first material only and/or particles formed of the second material only.

The shell at least partially coats the core. Typically, the shell substantially coats the core, more typically completely coats the core (i.e. the coating is continuous).

The inventors have surprisingly found that the sintering powder as described herein may be sintered at low temperatures with the application of only very low pressure, typically substantially no pressure. As a result, formation of a sintered joint between work pieces using the sintering powder may occur with reduced damage to the work pieces. In addition, since the application of high pressures is not required, the formation of a sintered joint is simplified, and may be more easily automated.

The sintering powder preferably further comprises a capping agent at least partially coating the shell. The use of a capping agent may help to reduce agglomeration of the particles. Such agglomeration is unfavourable, since it may increase the sintering temperature of the sintering powder.

Accordingly, the use of a capping agent enables the formation of a sintered joint between work pieces at lower temperatures and, therefore, may help to reduce damage to a work piece caused by exposure to high sintering temperatures. In addition, the use of a capping agent may help to avoid degradation of the first and/or second material such as, for example, damage caused by exposure of the materials to air.

The capping agent may be inorganic and/or organic. Examples of organic capping agents include polymers and ligands.

The capping agent preferably comprises one or more of an amine, an alcohol, a fatty acid, a thiol and a surfactant. Such capping agents may form a weak bond with the second material. Accordingly the temperature required to break the bonding may be reduced, which may help to reduce the sintering temperature. In a preferred embodiment, the capping agent comprises oleate (such as, for example, sodium oleate) and/or octylamine.

In this embodiment, the metal particles may be substantially coated with the capping agent, or completely coated with a capping agent. Increasing the coverage of the capping agent on the metal particles may help to further reduce the agglomeration of the metal particles and, therefore, further reduce the sintering temperature. In addition, most of the metal particles may be coated with the capping agent, or substantially all of the metal particles may be coated with a capping agent.

The sintering powder preferably comprises up to 15 wt. % capping agent, more preferably from 0.1 to 5 wt. % capping agent, even more preferably about 0.5 wt. % capping agent. The term "wt. %" used in this regards is based on the total weight of the sintering powder. If the sintering powder comprises more than 15 wt. % capping agent, then higher temperatures may be required to melt the capping agent prior to sintering. Furthermore, the amount of organics contained in the resulting sintered joint may increase. If the sintering powder comprises less than 0.1 wt. % capping agent, then the capping agent may not adequately cover the surface of the metal. This may result in an increase in agglomeration of the particles and, therefore, an increase in the sintering temperature.

The first material preferably comprises one or more of copper, nickel, tin, molybdenum, tungsten, aluminum, graphene, boron nitride, boron carbide and aluminium nitride. Such materials may exhibit a favorable combination of low cost and high electrical conductivity.

More preferably, the first material comprises one or more of copper, nickel, tin and molybdenum. Apart from the low cost and utility, the use of copper, nickel, tin and molybdenum may reduce the effect of CTE (coefficient of thermal expansion) mismatch of adjacent materials at the interfaces of a sintered joint formed using the sintering powder. The thermal stress caused due to CTE mismatch is the main cause for thermal fatigue of sintered joints. The molybdenum, nickel, copper and/or tungsten of the core may act as a thermal bridge between the adjacent materials at the interface in electronic packaging. In a particularly preferred embodiment, the first material comprises copper. The first material may comprise an alloy of one or more of copper, nickel, tin, molybdenum, tungsten and aluminum.

The second material preferably comprises one or more of silver, gold, palladium, platinum and graphene, more preferably silver. Such materials are particularly effective at reducing oxidation of the core. In addition, such materials may be effectively coated onto nanoparticles of the first material. The second material may comprise an alloy of one or more of silver, gold, palladium and platinum.

In a particularly preferred embodiment, the first material comprises copper and the second material comprises silver. Such a combination is particularly effective at resulting in a sintering powder exhibiting high electrical conductivity, low cost and reduced surface oxidation. Silver and copper have excellent electrical and thermal conductivity, and are therefore capable of forming a sintered joint with high electrical and/or thermal conductivity. Accordingly, the use of silver and copper makes the sintering powder particularly suitable for use in electronics applications, such as, for example, die attachment and microelectronic packaging. Copper is particularly low cost. Silver is particularly suitable for reducing oxidation of copper.

The particles preferably have a D95 of less than 100 nm, more preferably a D50 of from 1 nm to 30 nm, even more preferably a D50 of from 5 nm to 30 nm. Particles larger than 100 nm may result in a low surface-to-volume ratio, thereby requiring higher sintering temperatures and/or pressures.

In an alternative embodiment, the particles may have a D95 of from 0.1 to 10 µm. Larger particle sizes may require less capping agent. Accordingly, due to the reduction in residual organics in the resulting joint, the resistivity is much lower. In this alternative embodiment, the sintering powder may comprise less than 15 wt. % capping agent, typically about 3 wt. % capping agent.

The shell may comprise a layer of the second material and a layer of a third material different to the second material. The third material may comprise, for example, one or more of silver, gold, palladium, platinum and graphene. The presence of multiple layers in the shell may serve to reduce the thermal stress in a sintered joint formed using the sintering powder. The additional layer may act as a thermal bridge, thereby reducing CTE mismatch.

In a further aspect, the present invention provides nanoparticles comprising:
 a core comprising a first material; and
 a shell at least partially coating the core, the shell comprising a second material having a lower oxidation potential than the first material.

The nanoparticles may be used as a sintering powder. The preferred features of the first aspect of the present invention are applicable to this aspect.

In a further aspect, the present invention provides a sintered joint formed using the sintering powder as described herein. Such a sintered joint may exhibit particularly high strength and/or particularly high electrical and thermal conductivity. Furthermore, the sintered joint may exhibit very little change in shear strength following thermal shock, typically substantially no change in shear strength.

In a further aspect, the present invention provides an LED (light-emitting diode), MEMS (microelectromechanical system), OLED (organic light-emitting diode) or PV cell (photovoltaic cell) comprising the sintered joint described herein.

In a further aspect the present invention provides a sintering paste comprising:
 the sintering powder as described herein;
 a binder;
 a solvent; and
optionally a rheology modifier and/or an organosilver compound and/or an activator and/or a surfactant and/or wetting agent and/or hydrogen peroxide or organic peroxides.

The paste may be printable and/or dispensable and/or jettable and/or pin transferable. The paste may have viscosity and flow characteristics particularly favorable for dispensing, meaning that the paste may be used as a one-to-one replacement for solders.

Compared to sintering pastes known in the art, the sintering paste of the present invention exhibits high stability at room temperature. This means that low temperature storage of the sintering paste is not required. This is a particularly important advantage of the sintering paste of the present invention.

The binder and/or solvent are typically selected so that they are able to be removed from the paste (for example by evaporation and/or burn out) at a temperature below the targeted sintering temperature of the sintering powder. This may help to promote near complete sintering of the metal particles. When organic material remains in the joint during sintering, inadequate sintering of the metal particles may occur. This may result in a weak sintered joint.

The binder may serve to bind the paste together so that it is easier to handle and position accurately in the location of a desired sintered joint. Examples of suitable binders include, but are not restricted to, thermoplastic polymers, such as, for example, poly(methyl methacrylate), polyamides, polyethylene, polypropylene, polystyrene; or thermosetting polymers, such as, for example, polyurethanes, polycyanurates, epoxy resin, polyimides, melamine resin and bismaleimide resin. Particularly preferred examples include hydroxypropylmethylcellulose, triacetin and polyvinyl acetate. Preferably the binder comprises an epoxy-based resin. Epoxy-based resin may be particularly effective at binding the paste together so that the paste is easier to handle and may be easier to position accurately in the location of a desired sintered joint. Furthermore, the use of epoxy resin may result in the formation of a stronger joint prior to sintering, meaning that there is no requirement to hold together the work pieces to be joined prior to sintering. The use of epoxy resin is particularly advantageous when the capping agent comprises an amine functional group. In this case, the amine acts as a hardener forming a cross-linked structure. This may result in a particularly strong joint prior to sintering.

The solvent preferably comprises a monoterpene alcohol and/or a glycol and/or glycol ether, preferably terpineol and/or diethylene glycol mono-n-butyl ether. Monoterpene alcohol and/or a glycol ether may be particularly effective at dispersing the metal particles within the paste, resulting in a homogeneous distribution of metal particles in the matrix of organic components with reduced cluster aggregation and/or agglomeration. The use of monoterpene alcohol and/or a glycol ether may serve to increase the flow-ability and printer-ability of the sintering paste.

A rheology modifier may be added to control the viscosity of the paste. Examples of suitable rheology modifiers include, but are not restricted to, Thixcin R, Crayvallac Super, and combinations thereof.

During sintering, the organosilver compound may break down to metallic silver, which may increase the thermal conductivity of the sintered joint. The organosilver compound may comprise one or more of short or long chain carboxylic acids (C=1 to 30), such as, for example, silver stearate, silver palmitate, silver oleate, silver laurate, silver neodecanoate, silver decanoate, silver octanoate, silver hexanoate, silver lactate, silver oxalate, silver citrate, silver acetate and silver succinate. In some embodiments, the organosilver compound may be omitted.

An activator may be added to remove any metal oxide that may be present from the surface being printed and/or to remove any oxides that may be present in the sintering powder. Aryl or alkyl carboxylic acids may be used as activators, such as, for example, one or more of adipic acid, succinic acid and glutaric acid.

A surfactant may be added to the sintering paste to help disperse the sintering powder in the sintering paste. Examples of suitable surfactants include, but are not restricted to, Disperbyk 163, IGEPAL CA-630, lauryl glucoside and TritonX 100.

The sintering paste preferably further comprises a peroxide. Examples of suitable peroxides include, but are not restricted to, hydrogen peroxide or organic peroxides, such as, for example, tertiary-butyl hydroperoxide and tertiary-butyl peroxy-2-ethylhexanoate. Peroxide introduces oxygen into the paste, which may aid sintering of the paste beneath the die area in a die attach method. The oxygen may also enable sintering of the metal particles under an inert atmosphere, such as, for example, a nitrogen atmosphere. The sintering paste preferably comprises up to 3 wt. % hydrogen peroxide or organic peroxides, preferably from 0.5 to 2 wt. % hydrogen peroxide or organic peroxides, more preferably from 0.7 to 1.8 wt. % hydrogen peroxide or organic peroxides. Liquid peroxides are preferred to control rheology and silver settling.

The sintering paste preferably comprises:
from 1 to 15 wt. % binder; and/or
from 1 to 30 wt. % solvent; and/or
up to 5 wt. % rheology modifier; and/or
up to 10 wt. % an organosilver compound; and/or
up to 2 wt. % activator; and/or
up to 6 wt. % surfactant; and/or
up to 2 wt. % hydrogen peroxide or organic peroxides.

Binder and/or solvent contents within these ranges may help to provide the sintering paste with particularly desirable flow-ability and printer-ability. Preferably the sintering paste comprises from 2 to 8 wt. %, binder. In one embodiment the sintering paste comprises about 4.5 wt. % binder. Preferably the sintering paste comprises from 5 to 30 wt. %, solvent. In one embodiment the sintering paste comprises about 26 wt. % solvent. The sintering paste may comprise 0 to 5 wt. % rheology modifier and/or 0 to 2 wt. % activator and/or 0 to 6 wt. % surfactant and/or 0 to 2 hydrogen peroxide or organic peroxides. The sintering paste may comprise from 62 to 90 wt. % sintering powder. The sintering powder may form the balance of the sintering paste.

In a further aspect the present invention provides a sintering paste comprising:
the sintering powder as disclosed herein;
an organosilver compound;
a solvent; and
optionally an activator and/or rheology modifier and/or surfactant and/or hydrogen peroxide or organic peroxides.

The sintering paste preferably further comprises a fatty acid, preferably one or more of: short or long chain (C=2 to 30) carboxylic acids or di-carboxylic acids or hydroxyl carboxylic acids, more preferably lauric acid, stearic acid, neodecanoic acid, stearic acid, oleic acid, oxalic acid, malonic acid, succinic acid, adipic acid, maleic acid, citric acid or lactic acid; or short or long chain (C=2 to 30) amines, more preferably butyl amine, hexyl amine, octyl amine, dodecyl amine or hexadecyl amine; or surfactants, more preferably triton X100, IGEPAL CA-630 or lauryl glucoside. The presence of fatty acids helps to bind the paste together. In other words, the presence of a fatty acid avoids the need for a separate binder, such as the epoxy based resin binder discussed above. Accordingly, the total amount of organics in the paste is less, resulting in a stronger final joint.

Preferably the sintering paste is substantially resin free, more preferably completely resin free. The presence of resin may reduce the thermal and electrical conductance of the silver. The solvent preferably comprises a monoterpene alcohol and/or a glycol and/or glycol ether, more preferably a terpineol and/or diethylene glycol mono-n-butyl ether.

The sintering paste preferably comprises:
from 1 to 30 wt. % solvent; and/or
up to 50 wt. % organosilver compound, preferably from 0.1 to 25 wt. %, more preferably from 0.1 to 10 wt. %, even more preferably from 0.1 to 9 wt. %; and/or
up to 5 wt. % rheology modifier; and/or
up to 2 wt. % activator; and/or
up to 6 wt. % surfactant; and/or
up to 2 wt. % hydrogen peroxide or organic peroxides.

The sintering paste may comprise 0 to 5 wt. % rheology modifier and/or 0 to 2 wt. % activator and/or 0 to 6 wt. % surfactant and/or 0 to 2 wt. % hydrogen peroxide or organic peroxides. The sintering powder may form the balance of the sintering paste.

In a further aspect the present invention provides a sintering film comprising the sintering powder as described herein and a binder. The film may be applied at the wafer level, die level, package/substrate level, and/or module level. Such a film may be obtained, for example, by printing the sintering paste as described herein onto a polyester sheet, heating the paste to at least partially remove the solvent and form a film, and then removing the film from the polyester sheet. The film as described herein is especially advantageous since it can be transferred on the die by simply pressing the die on to the film at slightly elevated temperature. Transferred film is an alternate application method, beneficially offered in certain situations. The film may be formed on a polymeric, glass, metal or ceramic substrate or directly on a wafer. The film may be on a polymeric substrate comprising polyester. The film may be formed on a polymeric substrate, wherein the polymeric substrate comprises a release coating. The film may be produced by applying the paste compositions by printing or casting of the material. The film may be produced by printing in a continuous layer. Alternatively, the film may be produced by printing to form an array of discrete shapes.

In a further aspect the present invention provides a method of die attachment comprising:
(i) placing the sintering film described herein between a die and a substrate to be joined; and
(ii) sintering the sintering film,
wherein the sintering is carried out without the application of pressure.

This "low pressure" or "pressure-less" sintering is particularly advantageous, since it may make automation of the process simpler. Furthermore, damage to the work pieces may be reduced. Further advantages over methods employing pressured sintering include: shorter time required for die-placement (high UPH), low-pressure requirement for placement (highly advantageous for processing thin wafers), compatibility with commercial die-bonder and sintering in external heating equipment (batch process to improve UPH).

The sintering is preferably carried out at a temperature of from 150 to 400° C. for up to 120 minutes. Such conditions may result in particularly effective sintering of the sintering film while avoiding damage to the work pieces.

Step (i) preferably comprises:
(a) applying the sintering film to the die to form an assembly having a die side and a sintering film side; and (b) contacting the film side of the assembly with the substrate.

Such a step may make automation of the process simpler, and may be carried out, for example, by the use of a stamp.

Step (a) is preferably carried out at a temperature of from 15 to 400° C. and a pressure of from 0.1 to 5 MPa for from 0.1 to 60 seconds. Such conditions may result in particularly effective application of the sintering film while avoiding damage to the die.

Step (b) is preferably carried out at a temperature of from 15 to 400° C. and a pressure of from 0.1 to 40 MPa for from 0.1 to 60 minutes. Such conditions may result in particularly effective contacting of the die to the substrate while avoiding damage to the die or substrate.

In a further aspect, the present invention provides a method of die attachment comprising:
 (i) placing the sintering film described herein between a die and a substrate to be joined; and
 (ii) sintering the sintering film,
wherein the sintering is carried out while applying a pressure of from 0.1 to 40 MPa.

In a further aspect, the present invention provides a method of wafer bonding comprising:
 (i) placing the sintering film described herein between two or more wafers to be joined; and
 (ii) sintering the sintering film,
wherein the sintering is carried out without the application of pressure.

In a further aspect, the present invention provides a method of transferring a sintering film to a component, comprising:
 applying the sintering film described herein to a substrate to form an assembly having a sintering film side and a substrate side;
 contacting the sintering film side of the assembly with a component;
 heating the assembly to a temperature of from 50 to 200° C.;
 applying a pressure of from 1 to 5 MPa to the assembly for from 0.1 seconds to 60 minutes; and
 separating the substrate from the sintering film.

The substrate may be polymeric. The sintering film may be substantially the same size as the component. The component may be an LED.

In a further aspect the present invention provides a method for die-attachment, comprising: applying the sintering film described herein to a substrate; placing a die on the film to form an assembly; applying a pressure of less than 2 MPa to the assembly; and sintering the assembly at a temperature of 100 to 400° C. for 0.1 s to 5 minutes, applying a pressure of less than 3 MPa. The same assembly may be further sintered at a temperature of 175 to 400° C. in a pressure-less manner using variety of processes and equipment that provide appropriate degree of heat to initiate and complete sintering.

In a further aspect the present invention provides a method for die-attachment, comprising: applying the sintering film described herein to a substrate; placing a die on the film to form an assembly; applying a pressure of less than 5 MPa to the assembly; and sintering the assembly at a temperature of 100 to 400° C. for 0.1 s to 60 minutes, applying a pressure of less than 40 MPa. The same assembly may be further sintered at a temperature of 175 to 400° C. in a pressure-less manner using variety of processes and equipment that provide appropriate degree of heat to initiate and complete sintering.

In a further aspect the present invention provides a method for die-attachment, comprising: applying the sintering film described herein on a back side of a wafer; dicing the wafer to form a plurality of die; placing at least one die on a substrate to form an assembly; applying a pressure of more than 1 MPa to the assembly; and sintering the assembly at a temperature of 100 to 400° C. for 0.1 s to 60 minutes. The same assembly may be further sintered at a temperature of 175 to 400° C. in a pressure-less manner using variety of processes and equipment that provide appropriate degree of heat to initiate and complete sintering.

In a further aspect the present invention provides a method for wafer bonding, comprising: applying the sintering film described herein on a back side of a wafer; placing one more same or different types of wafer on the sinterable Ag film containing wafer to form an assembly; applying a pressure of more than −0.1 MPa to the assembly; and sintering the assembly at a temperature of 100 400° C. for 0.25 s to 120 minutes. The same assembly may be further sintered at a temperature of 175 to 400° C. in a pressure-less manner using variety of processes and equipment that provide appropriate degree of heat to initiate and complete sintering.

In a further aspect the present invention provides a method for wafer bonding, comprising: applying the sintering film on a back side of a wafer; placing one more same or different types of wafer on the sintering film containing wafer to form an assembly; applying a pressure of less than 40 MPa to the assembly; and sintering the assembly at a temperature of 100 to 400° C. for 0.25 s to 120 minutes. The same assembly may be further sintered at a temperature of 175 to 400° C. in a pressure-less manner using variety of processes and equipment that provide appropriate degree of heat to initiate and complete sintering.

In a further aspect the present invention provides the use of the sintering powder as described herein or the sintering paste or film as described herein in a method selected from: die attachment (e.g. chip-to-board, chip-to-substrate, chip-to-heat sink, chip-to-fixture), wafer-to-wafer bonding (e.g. chip-to-heat sink), reflective layer printing, hermetic and near hermetic sealing (for example for packages and perimeter seals), the production of interconnect lines (for example circuitry, pads), via filling in semiconductor devices and substrates, and flip-chip and wafer bumping.

In a further aspect, the present invention provides a method of manufacturing the sintering powder as described herein, the method comprising:
 (i) providing a solution comprising a reducing agent and particles containing a first material;
 (ii) reducing the concentration of the reducing agent in the solution from step (i);
 (iii) contacting the solution from step (ii) with a source of a second material to at least partially coat at least some of the particles containing a first material with the second material, the second material having a lower oxidation potential than the first material; and
 (iv) recovering at least some of the particles containing a first material coated with the second material from the solution of step (iii).

The solution of step (i) may be an aqueous solution. When the second material comprises a metal, the second material source may comprise a metal salt, for example an acetate and/or nitrate.

The particles containing the first material are typically nanoparticles. The term "nanoparticles" as used herein may encompass particles having a longest dimension of from 1 to 100 nm. The longest dimension may be determined by X-ray diffraction.

Without being bound by theory, it is considered that the formation of the "shell-coated" particles is driven by a transmetallation reaction. The reduction of the source of second material (e.g. silver nitrate) occurs on the surface of the pre-formed particles containing the first material (e.g. copper), where the first material itself acts as a reducing agent for the second material source. Excess of strong reducing agent (e.g. hydrazine or borohydride) is used to prevent the first material (e.g. copper) from being oxidised. From 0.5 to 1 mole of reducing agent is typically used. However, if a large excess of reducing agent remains, then simultaneous reduction of the second material source may occur, which may disrupt the formation of the core-shell structure.

Step (ii) may comprise removal of the reducing agent from the solution. Alternatively, or in addition, step (ii) may comprise chemical modification and/or deactivation of the reducing agent. In step (ii), the concentration of reducing agent is preferably reduced to substantially zero, more preferably zero. The reducing agent may be destroyed in step (ii), for example using a chemical method.

Step (i) may comprise:
  providing a solution comprising a source of first material; and
  contacting the solution with a reducing agent.

Contacting the solution with a reducing agent typically comprises adding the reducing agent to the solution followed by stirring the solution. The solution may be agitated, for example using sonication, so as to increase the yield of particle formation and to reduce agglomeration of the particles. When the first material comprises a metal, the first material source may comprise a metal salt. The solution may be heated once the reducing agent has been added. Step (i) may be advantageously carried out without irradiation of the solution of the source of the first material and the reducing agent.

In step (iii), the particles containing a first material coated with the second material are typically produced in powder form. Accordingly, in contrast to methods in which the particles are produced in a dispersed state, separation of the particles does advantageously not require acidification of the dispersion.

Preferably, the first material comprises copper and the second material comprises silver. Copper is particularly effective at reducing the silver source without disrupting the formation of the core-shell structure.

The reducing agent preferably comprises hydrazine (e.g. hydrazine hydrate) and/or borohydride (e.g. sodium borohydride).

In a preferred embodiment:
  the reducing agent comprises hydrazine; and
  step (ii) comprises contacting the reducing agent with acetone under basic conditions.

Excess hydrazine is destroyed by the addition of acetone in basic medium. The excess hydrazone reacts with acetone in basic medium to form the corresponding alkane. This works on the principle of Wolf-Kishner reaction. In this embodiment, it is preferred that the first material comprises copper and the second material comprises silver. The basic conditions may be provided by, for example, hydroxide ions.

In a preferred embodiment:
  the first material comprises copper;
  the second material comprises silver; and
  the weight ratio of silver to copper in step (iii) is from 40:60 to 85:15.

Higher levels of copper may result in the silver shell not adequately coating the copper particles. Lower levels of copper may result in increased manufacturing costs.

The solution of step (i) preferably comprises capping agent. This may result in the particles being at least partially coated with a capping agent.

Step (iv) may comprise filtration and/or centrifugation. The recovered particles may be washed, for example with water and/or acetone.

In a further aspect, the present invention provides a method of manufacturing a sintering powder comprising copper-containing nanoparticles coated with a layer comprising silver, the method comprising:
  (i) providing a solution comprising a hydrazine reducing agent and copper-containing nanoparticles;
  (ii) contacting the solution from step (i) with acetone under basic conditions to reduce the concentration of the hydrazine reducing agent in the solution;
  (iii) contacting the solution from step (ii) with a silver salt to at least partially coat at least some of the copper-containing nanoparticles with a layer comprising silver; and
  (iv) recovering at least some of the copper-containing nanoparticles coated with the layer comprising silver from the solution of step (iii).

In step (ii), the concentration of the reducing agent is preferably reduced to substantially zero, more preferably zero. The excess reducing agent, typically hydrazine, is typically destroyed in step (ii). Step (ii) may comprise contacting the solution from step (i) with acetone and hydroxide ions.

In a further aspect, the present invention provides a method of manufacturing the sintering paste as described herein comprising:
  providing the sintering powder as described herein; and
  dispersing the sintering powder in a solvent together with a binder and optionally a rheology modifier and/or an organosilver compound and/or an activator and/or a surfactant and/or wetting agent and/or hydrogen peroxide or organic peroxides.

In a further aspect the present invention provides a method of manufacturing a sintered joint comprising the steps:
  providing the sintering powder as described herein or the sintering paste or film as described herein in the vicinity of two or more work pieces to be joined; and
  heating the sintering powder or sintering paste or film to at least partially sinter the metal.

Advantageously, the heating step may be carried out at atmospheric pressure.

The sintering powder or sintering paste or film may be placed in the vicinity of the work piece under low pressure (typically 1-5 MPa for 0.1 to 60 seconds at a temperature of about 175 to 250° C.).

The heating step is preferably carried out at a temperature of at least 140° C., more preferably from 150 to 350° C., even more preferably from 160 to 300° C. Temperatures lower than 140° C. may not result in adequate sintering of the particles in the sintering powder and/or may not result in adequate removal of the organics by evaporation and/or burn out. Temperatures higher than 350° C. may result in damage to the work pieces.

The invention will now be described in relation to the following non-limiting examples.

Example 1—Synthesis and Characterization of Core Shell Ag—Cu Nanoparticles

An aqueous solution of cupric acetate (154 g, 0.7713 m) was added to an aqueous solution of sodium oleate (30 g, 0.098 m) with continuous stirring. Hydrazine hydrate (300 g, 6 m) was added to the above solution. The resultant reaction mixture was stirred for 45 minutes followed by the addition of sodium hydroxide and acetone. The reaction mixture was then allowed to stir for 10 minutes. Aqueous solution of silver nitrate (70.67 g, 0.416 m) was then added to the reaction mixture and stirred for 1 hour. Formation of black color particle indicated the formation of nanoparticle. The resultant nanopowder was then filtered and washed with water and acetone.

In a similar fashion, different compositions of core shell structure were synthesized by changing the mole ratio of the silver and copper salt. Different composition of silver to copper core-shell structured nanoparticles were made by changing the molar concentration of the copper and silver precursors.

The XRD and SPR patterns confirm the structure to be "core shell". The XRD as shown in FIG. 1 reveals the presence of both copper and silver having a face centered cubic structure. The XRD pattern does not show the presence of any cupric/cuprous oxide peak. The particle size from the XRD pattern calculated by Scherrer's formula was around 20-25 nm. This particle size was confirmed by the use of a particle size analyzer (Microtrac Nanotrac Ultra NPA 253) which indicated a D50 of around 20 nm. The percentage of copper to silver was further confirmed by XRF analysis.

Figure 2:
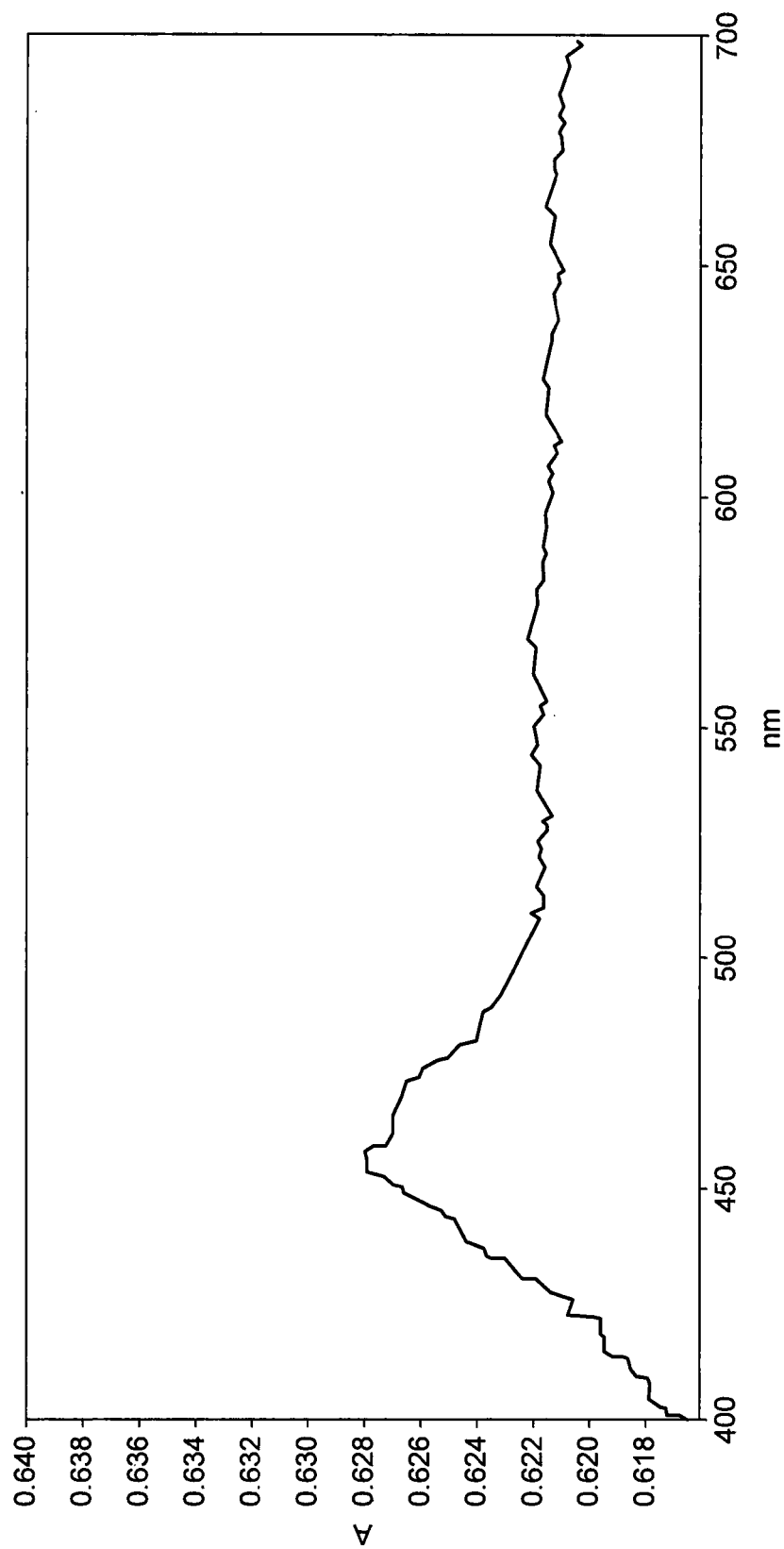
FIG. 2 shows a UV-vis spectrum of the sintering powder of Example 1.

The UV-vis spectrum (FIG. 2) shows the surface plasmon resonance at 456 nm which is typical for silver which in turn confirms the fact that silver is the shell and copper is the core.

Figure 3:
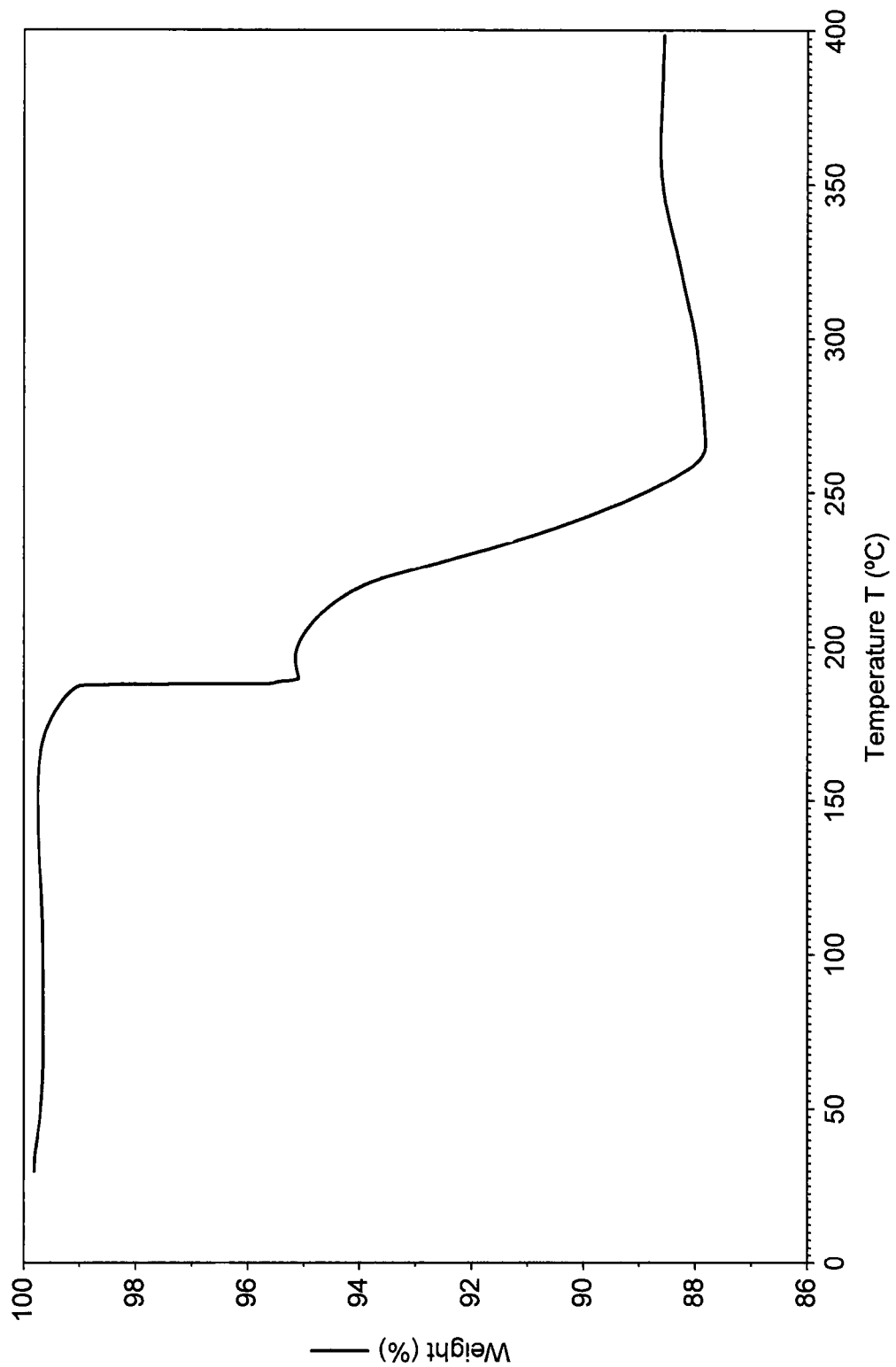
FIG. 3 shows a thermogravimetric analysis (TGA) plot of the sintering powder of Example 1.

The TGA (FIG. 3) shows a two-step decomposition process of the capping agent. A sharp drop is observed at 187° C. with a weight loss of around 5%. The second step involves a weight loss of around 8% at 190° C. The TGA graph clearly indicates that no oxidation of copper takes place till 300° C. A slight weight gain in the TGA curve above 300° C. reveals the oxidation of the copper.

Figure 4:
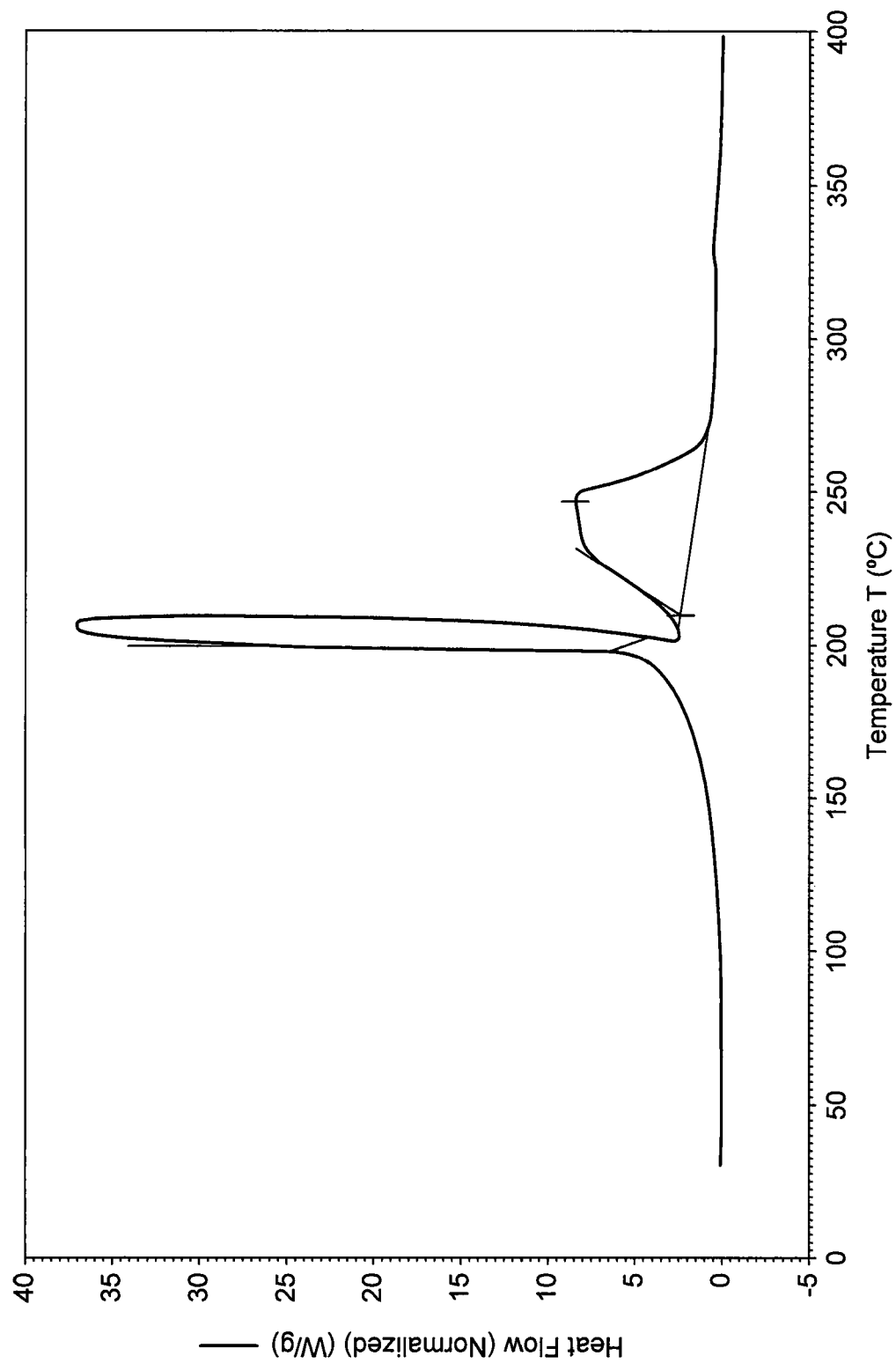
FIG. 4 shows a differential scanning calorimetery (DSC) plot of the sintering powder of Example 1.

The DSC (FIG. 4) shows two exothermic peaks with an onset temperature of 197° C. and 210° C. Both of the exothermic peaks indicate the detachment of the capping agent from the core shell and decomposition of the capping agent.

Figure 5:
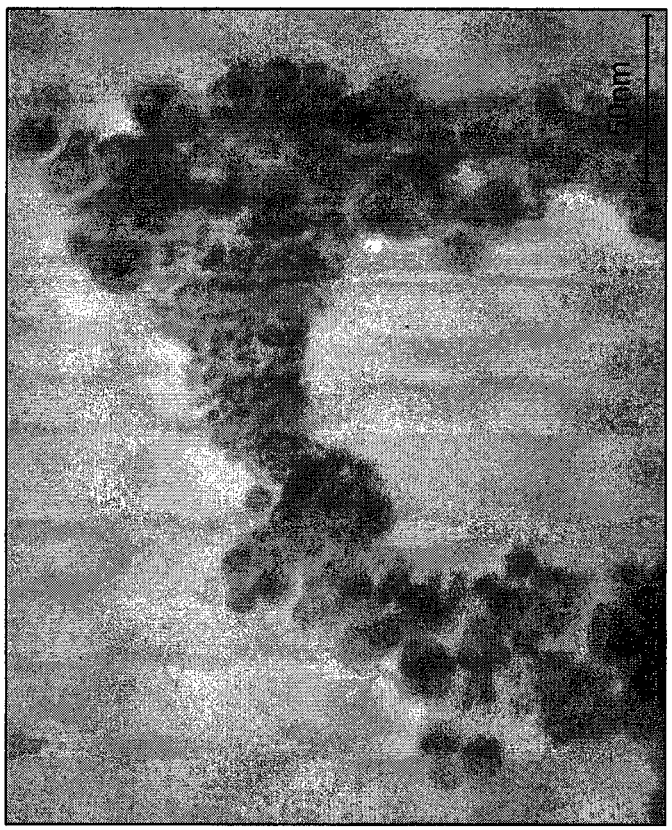
FIG. 5 shows transition electron microscope (TEM) micrographs of the sintering powder of Example 1.
Figure 5:
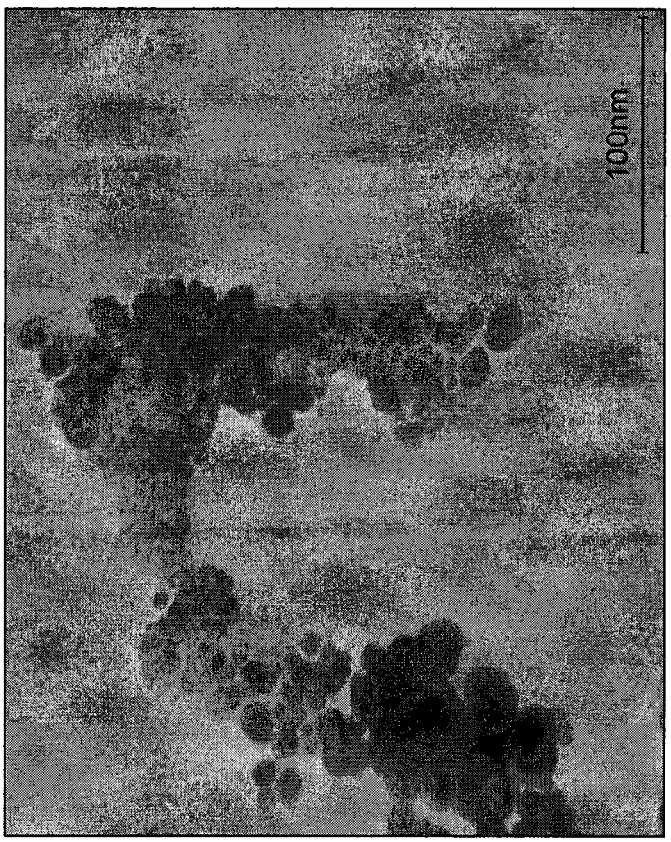

TEM micrographs (FIG. 5) indicate particles sizes of the nanoparticles of from 1 nm to 25 nm. The particles appear to be spherical in shape and do not show any agglomeration.

Example 2—Synthesis and Characterization of Ag—Ni Nanoparticle

An ethanol solution of nickel chloride (50 g, 0.2103 m) was added to octylamine (10 g, 0.07 moles). The reaction mixture was allowed to stir for 10 minute followed by the addition of NaOH and hydrazine hydrate (250 g, 5 moles). The resultant reaction mixture was then heated at 50-60° C. for 45 minutes. The reaction mixture was then cooled to room temperature. Glycolic solution of silver nitrate (40 g, 0.23 moles) was then added to the reaction mixture and stirred for 1 hour. The resultant nanopowder was then filtered and washed with ethanol and acetone.

Figure 6:
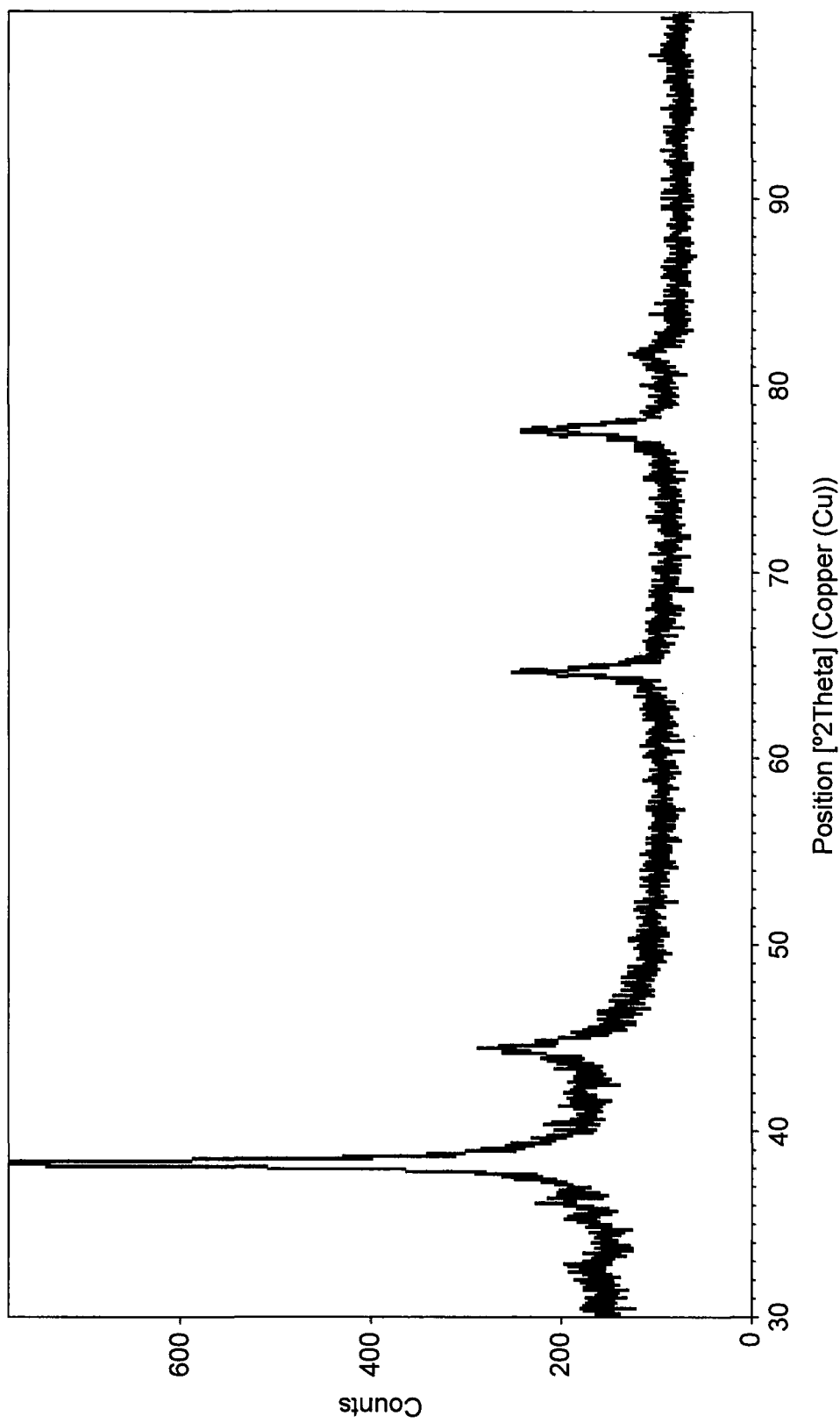
FIG. 6 shows a powder X-ray diffraction (XRD) pattern of the sintering powder of Example 2.
Figure 7:
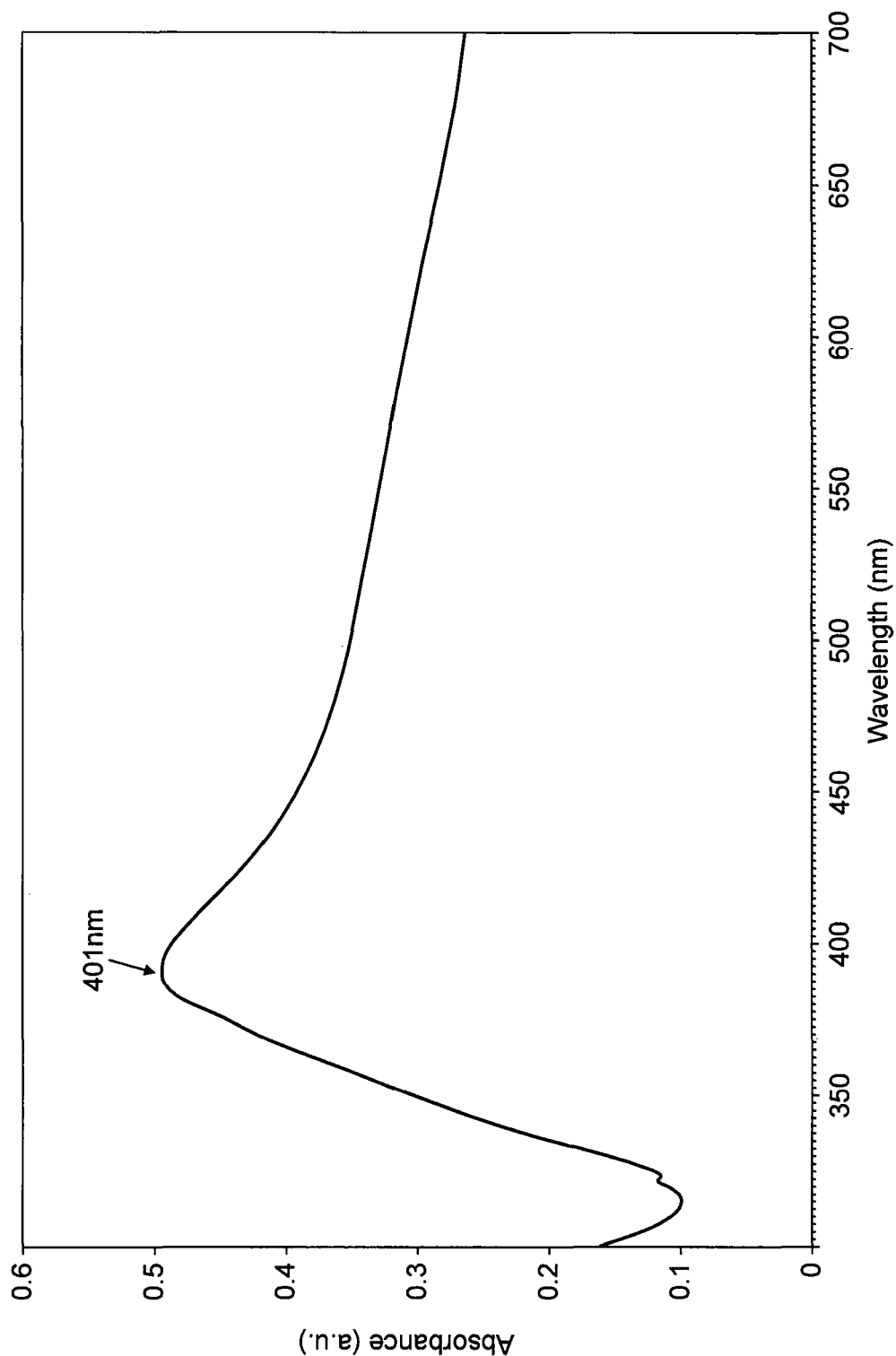
FIG. 7 shows a UV-vis spectrum of the sintering powder of Example 2.

The XRD and SPR patterns confirm the structure to be core shell. The XRD as shown in FIG. 6 reveals the presence of both nickel and silver having a face centered cubic structure. The particle size from the XRD pattern calculated by Scherrer's formula was around 10-55 nm. This particle size was confirmed by the use of a particle size analyzer (Microtrac Nanotrac Ultra NPA 253) which indicated a D50 of around 12 nm. The percentage of nickel to silver was 36:64 which was in conformity with XRF analysis.

Figure 8:
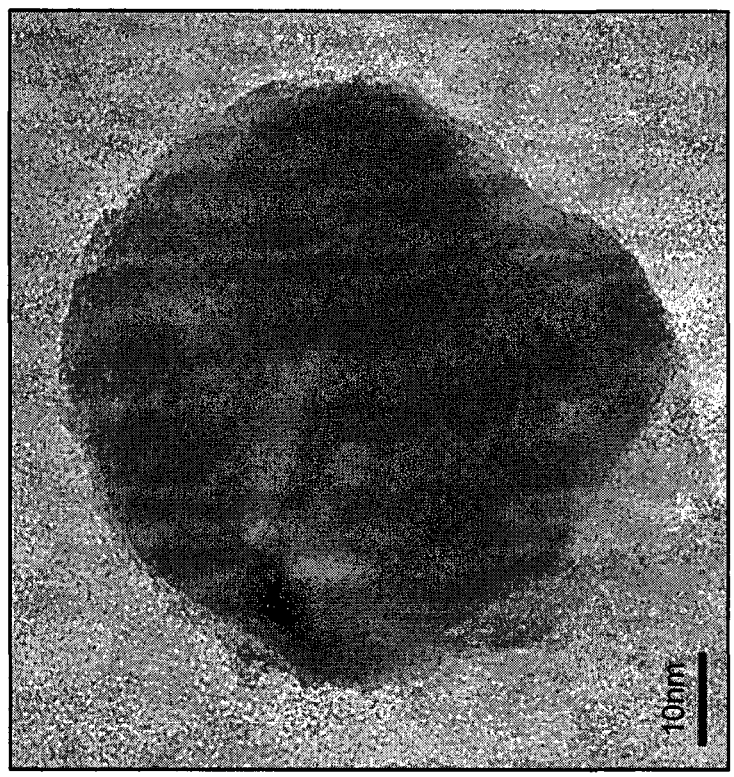
FIG. 8 shows transmission electron microscopy (TEM) images of the sintering powder of Example 2.
Figure 8:
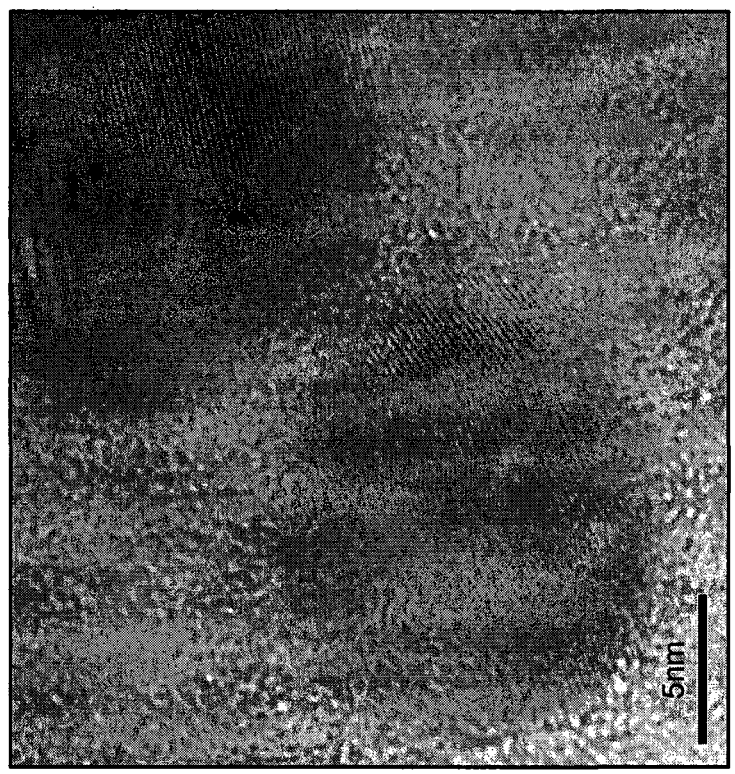

TEM images of the silver nickel nanoparticles (FIG. 8) reveal the formation of nanoparticles ranging from a size of 3 to 35 nm. The lattice fringes show the nature to be polycrystalline.

Example 3—Synthesis of Nano $Cu_{core}\ Ag_{shell}$ Paste

Sample 1: 0.1 g of lauric acid was added to 40 g of the powder of Example 1. To the mixture, 9.463 g of solvent mixture (4.69 g of terpineol, 4.69 g of triethylene glycol and 0.83 g of propylene carbonate) was added and mixed in an orbital mixer. After mixing it was milled in a three roll mill for a few minutes to provide a homogeneous paste.

Sample 2: 0.1 g of lauric acid was added to 40 g of the powder of Example 1. To the mixture, 0.956 g of silver lactate and 9.257 g of solvent mixture (4.377 g of terpineol, 4.377 g of triethylene glycol and 0.503 g of propylene carbonate) was added and mixed in an orbital mixer. After mixing it was milled in a three roll mill for a few minutes to provide a homogeneous paste Sample 3: To 40 g of the powder of Example 1, 0.264 g of thixcin R, 5.864 g of terpineol, 5.864 g of triethylene glycol, 0.5336 g of 1,3 propanediol and 0.5336 g of butyl carbitol and 0.264 g of BYK 163 was added and mixed in an orbital mixer. After mixing it was milled in a three roll mill for a few minutes to provide a homogeneous paste.

Sample 4: To 40 g of the powder of Example of 1, 0.264 g of thixcin R, 5.064 g of terpineol, 5.864 g of triethylene glycol, 0.528 g of 1,3 propanediol and 0.528 g of butyl carbitol and 1.064 g of myristic acid was added and mixed in an orbital mixer. After mixing it was milled in a three roll mill for a few minutes to provide a homogeneous paste.

Sample 5: To 40 g of the powder of Example 1, 2.664 g of acrylic acid, 5.328 g of octanol, 5.064 g of octadecene, 0.264 g of thixcin R was added and mixed in an orbital mixer. After mixing it was milled in a three roll mill for a few minutes to provide a homogeneous paste.

Sample 6: To 40 g of the powder of Example 1, 0.2664 g of thixcin R and 13.064 g of triethylene glycol was added and mixed in an orbital mixer. After mixing it was milled in a three roll mill for a few minutes to provide a homogeneous paste.

Sample 7: To 40 g of the powder of Example 1, 2.664 g of acrylic acid, 5.328 g of octanol, 5.064 g of octadecene, 0.264 g of thixcin R was added and mixed in an orbital mixer. After mixing it was milled in a three roll mill for a few minutes to provide a homogeneous paste.

Sample 8: To 40 g of the powder of Example 1, 0.2856 g of thixcin R, 0.5713 g of polydimethyl siloxane diglycidyl ether terminated, 14.6552 g of triethylene glycol, 1.628 g of terpineol was added and mixed in an orbital mixer. After mixing it was milled in a three roll mill for a few minutes to provide a homogeneous paste.

Sample 9: To 40 g of the powder of Example 1, 0.2856 g of thixcin R, 0.5713 g of silver oxalate and 16.28 g of triethylene glycol was added and mixed in an orbital mixer.

After mixing it was milled in a three roll mill for a few minutes to provide a homogeneous paste.

Sample 10: To 40 g of the powder of Example 1, 0.5333 g of glutamic acid, 0.5333 g of 1,3 propanediol, 0.5333 g of butyl carbitol, 5.7329 g of terpineol, 5.7329 g of triethylene glycol, and 0.266 g of BYK163 was added and mixed in an orbital mixer. After mixing it was milled in a three roll mill for a few minutes to provide a homogeneous paste.

Sample 11: To 40 g of the powder of Example 1, 1.013 g of silver lactate, 0.1066 g of Thixcin R, 0.1066 g of Lauric acid, 0.5333 g of propylene carbonate, 5.786 g of terpineol and 5.786 g of trigol was added and mixed in an orbital mixer at 1000 rpm. After mixing it was milled in a three roll mill for a few minutes to provide a homogeneous paste.

Sample 12: To 40 g of the powder of Example 1, 3.8604 of nano silver powder, 0.1103 g of Lauric acid, 0.9104 g of propylene carbonate, 5.144 g of terpineol and 5.144 g of trigol was added and mixed in an orbital mixer at 1000 rpm. After mixing it was milled in a three roll mill for a few minutes to provide a homogeneous paste.

Sample 13: To 40 g of the powder of Example 1, 1.588 g of nano silver powder, 0.5296 g of silver lactate, 0.1059 g of Lauric acid, 0.874 g of propylene carbonate, 4.94 g of terpineol and 4.94 g of trigol was added and mixed in an orbital mixer at 1000 rpm. After mixing it was milled in a three roll mill for a few minutes to provide a homogeneous paste.

Sample 14: To 40 g of the powder of Example 1, 1.056 g of nano silver powder, 1.056 of silver lactate, 0.1056 g of Lauric acid, 0.6616 g of propylene carbonate, 4.936 g of terpineol, 4.936 g of trigol and 0.21112 g of BYK163 was added and mixed in an orbital mixer at 1000 rpm. After mixing it was milled in a three roll mill for a few minutes to provide a homogeneous paste.

Sample 15: To 40 g of the powder of Example 1, 3.92 g of terpineol, 9.78 g of triethylene glycol, and 1.10 g of sodium bis (2-ethylhexyl) sulfosuccinate was added and mixed in an orbital mixer at 1000 rpm. After mixing it was milled in a three roll mill for a few minutes to provide a homogeneous paste.

Example 4—Printing

Figure 9:
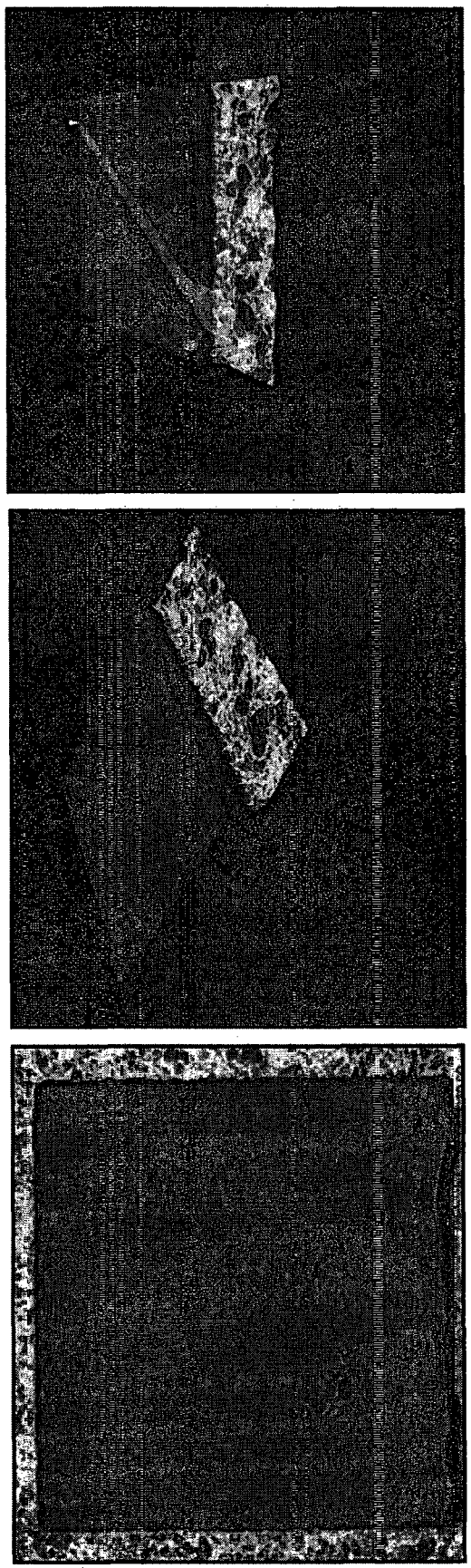
FIG. 9 shows microscopic images of the printed pattern of Example 4.

Screen/stencil printing is a widely used technology for printed electronics and metallization of solar cells. The technique relies on the pattern transfer from the stencil to the substrate. AgCu, AgNi and AgMo core-shell powder-containing pastes accordingly to the present invention were printed using a DEK printer on direct bond copper (DBC) coated with Ni/Ag or Ni/Au using a 3 mil stencil. The microscopic images of the printed pattern as shown in FIG. 9 and indicate good printability of the $CU_{core}\,Ag_{shell}$ nano paste. The printed patterns show no undulations with a thickness of around 75 microns.

Example 5—Pressure Sintering and Die Attachment

Figure 10:
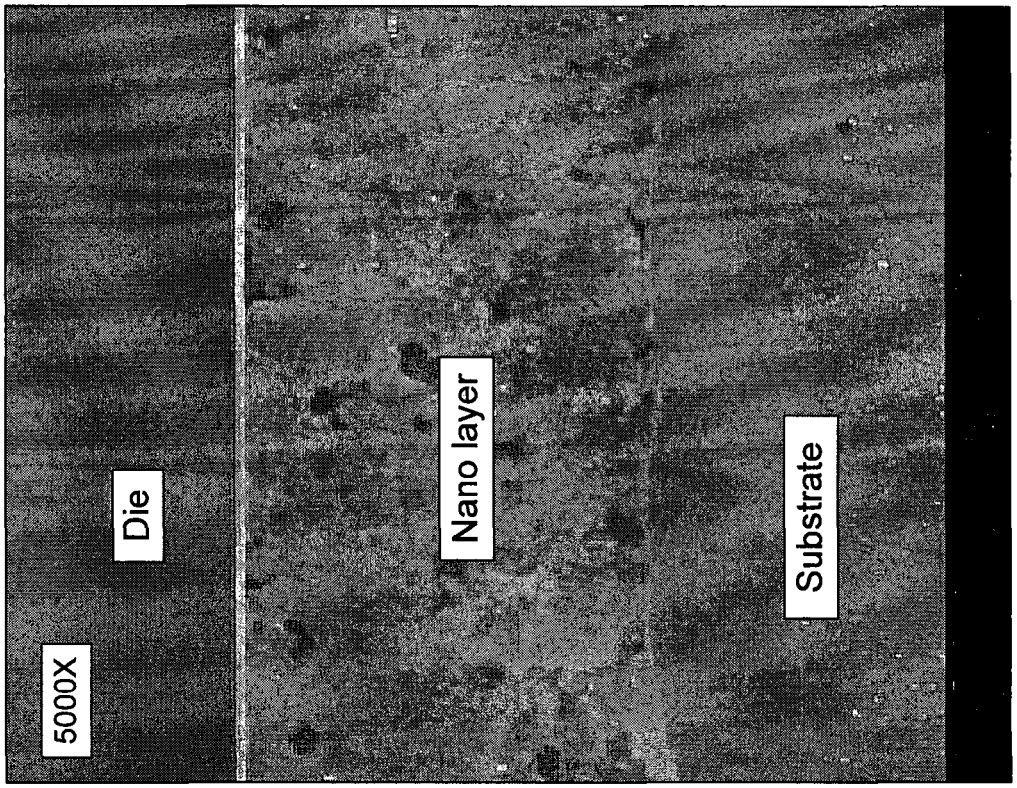
FIG. 10 shows SEM images of the sintered layer of Example 5.
Figure 10:
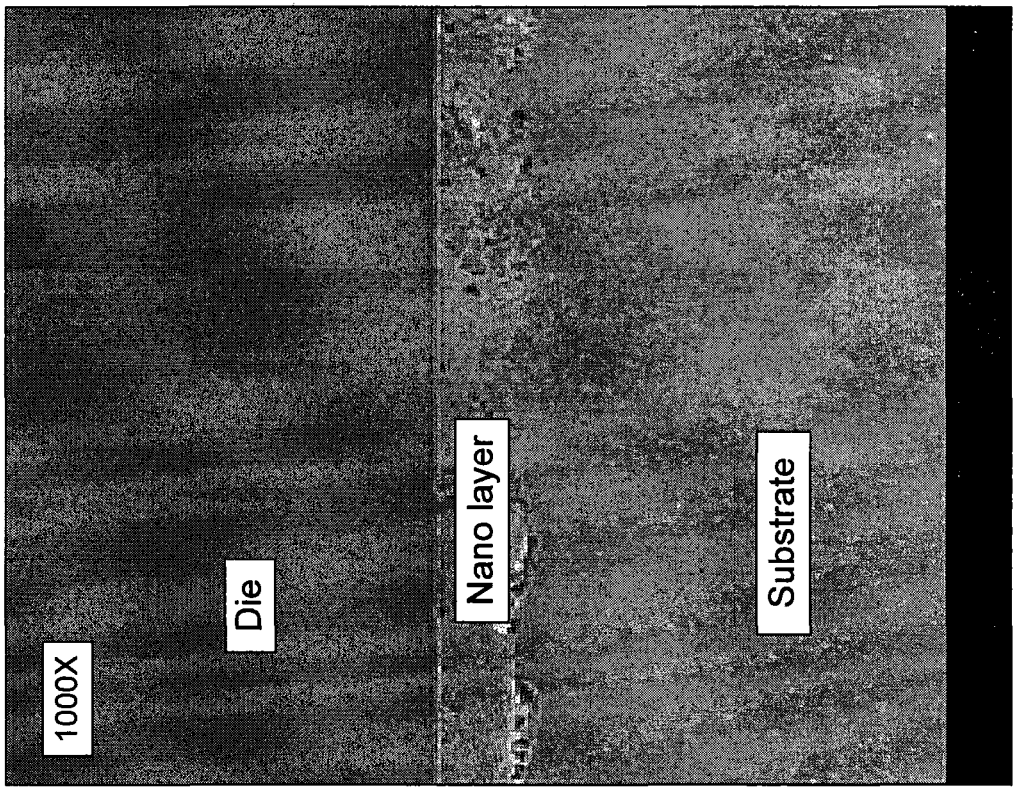

To the printed pattern on direct bond copper (DBC) coated with Ag/Ni or Au/Ni, dummy silicon die coated with Ag/Ni or Au/Ni was placed using a Tresky die bonder with different pressure. The SEM images as shown in FIG. 10 reveals a good densification of the sintered layer. Both the interfaces (die side as well as the substrate side) show diffusion of the sintered layer.

The joint strength was determined using Dage series 4000. The shear strength was >40 MPa with a pressure ranging from 3-5 MPa. All the failures were cohesive failure. The die shear strength with different pressure is listed below in Table 1.

TABLE 1

| Die shear strengths for different sintering pressures. ||
| --- | --- |
| Sintering pressure | Die shear in MPa |
| 5 | >40 |
| 3 | >40 |
| 2 | >40 |
| 1 | 25-27 |
| 0.5 | 23-25 |

Example 6—Pressure-Less Sintering and Die Attachment

Figure 11:
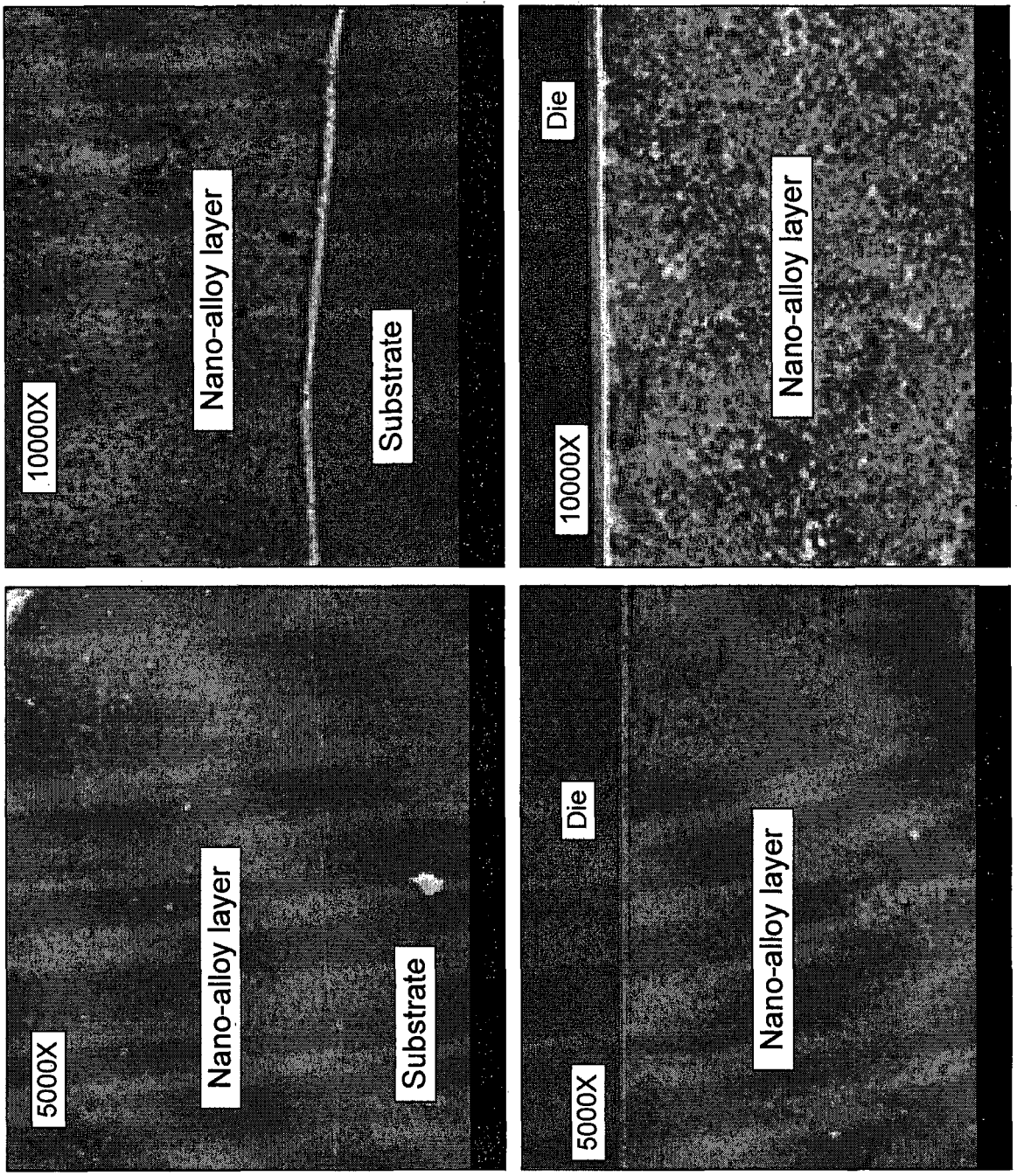
FIG. 11 shows SEM images of the sintered joints of Example 6.

To the printed pattern on direct bond copper (DBC) coated with Ag/Ni or Au/Ni, dummy silicon die coated with Ag/Ni or Au/Ni was placed using a die bonder. The whole was subjected to a firing temperature of 200° C.-300° C. for 45-90 minutes. The morphology of the sintered joints was cross sectioned. The microstructure was analyzed using SEM. The SEM images as shown in FIG. 11 reveal a good densification of the sintered layer. Both the interfaces (die side as well as the substrate side) show diffusion of the sintered layer. The joint strength was determined using Dage series 4000. The die shear when done at room temperature as well as high temperature does not show any deterioration (20-30 MPa).

Example 7—Dispensing Application

Figure 12:
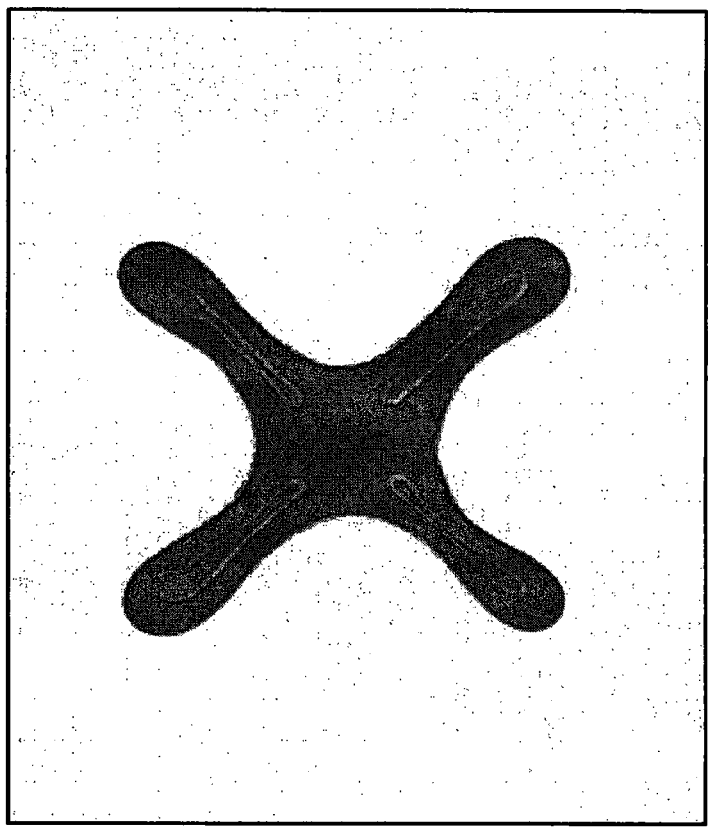
FIG. 12 shows microscopic images of the dispensed pattern of Example 7.
Figure 12:
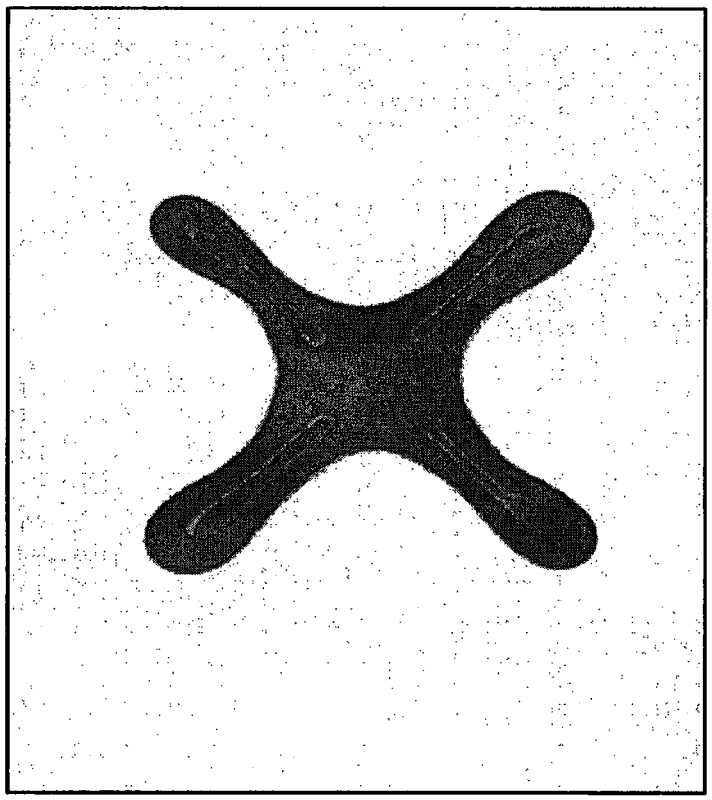

AgCu, AgNi and AgMo particle-containing pastes according to the present invention were dispensed using a Datacon die bonder on direct bond copper (DBC) coated with Ni/Ag or Ni/Au and Ni/Ag or Ni/Au lead frames. The microscopic images of the dispensed pattern are shown in FIG. 12. The assembly was then sintered at 300° C. for 45 minutes in a box oven. The die shear obtained was around 16 MPa.

Example 8—Film Formation

A film of around 10-50 micron was produced using a tape caster (AgCu particle containing paste). The film was stamped at 150° C. with a pressure of 2.5 MPa for 1 second. A good transferability of film from the Mylar sheet to the die (Au/Ni finish) was observed with no flares and cracks in the film. The stamped die was then placed on DBC (Au/Ni finish) at 300° C. under 3 MPa and 1 MPa pressure for 90 seconds. A good die shear of around 55 MPa and 30 MPa respectively were observed. The failure mode was a bulk failure. One of the most promising result was the increase in joint strength of around 25% was observed when the die shear was done at high temperature (260° C.).

Example 9—Flip Chip Attachment

The copper core silver shell paste film (Example 3) was explored for flip chip type of attachment. In this process, film was casted on a Mylar sheet with the help of a Tape caster. The casted film was then stamped on silicon wafer using a carver press. The stamped silicon wafer was then diced using a dicing machine followed by the UV curing. The diced wafer was then attached to the substrate using Datacon Die bonder. The process steps were as follows: (i) film formation, (ii) film transfer to Si wafer, (iii) dicing of coated Si wafer, (iv) die attachment using die bonder, (v) pressure-less sintering, and (vi) die shear and characterisation. Further details and conditions of these steps are set out below:

Film Casting and Stamping Conditions:

The film of copper silver paste was casted with the help of a tape caster on Mylar sheet by rolling the paste on to the Mylar sheet at 150° C. for 15 minutes. The casted film was then transferred to the silicon die using a Carver press where the upper plate was set at 130° C. and the low plate was set to 50° C. Pressure of 10 MPa was applied for 2 minutes. The stamped silicon wafer was then. The thickness of the film was found to be around 25 micron.

Die Attachment and Characterization:

The diced silicon wafer was then attached to the Au finished DBC with Datacon Die bonder. The tool temperature of 150° C. and a base plate temperature of 225° C. were set and a pressure of 0.1 MPa was applied for 1 second. The assembly was then post cured at 225° C. for 1 hour. The CSAM image of the sintered assembly did not show any kind of delamination or voids.

The cross section the SEM of the above mentioned assembly showed a good diffusion of the nanoparticle on both the substrate side and on the die. The dies were sheared and the joint strength was found to be around 30 MPa with a bulk failure mode.

Thermal Reliability:

The assembled samples were tested for the thermal reliability test which includes thermal shock and thermal cycling (−40° C. to 125° C.) for 1000 cycles. It was found that no deterioration was observed in joint strength as well as no delamination at the interfaces.

The foregoing detailed description has been provided by way of explanation and illustration, and is not intended to limit the scope of the appended claims. Many variations in the presently preferred embodiments illustrated herein will be apparent to one of ordinary skill in the art and remain within the scope of the appended claims and their equivalents.

The invention claimed is:

1. A sintering powder, wherein particles of the sintering powder comprise:
   a core comprising a first material comprising copper; and
   a shell at least partially coating the core, the shell comprising a layer of a second material having a lower oxidation potential than the first material, the second material comprising silver; and
   a capping agent at least partially coating the shell, the capping agent comprising octylamine;
   wherein the particles have a D50 of from 1 to 30 nm.

2. The sintering powder of claim 1, wherein the particles have a D95 of less than 100 nm.

3. The sintering powder of claim 1, wherein the particles have a D95 of from 0.1 to 10 μm.

4. The sintering powder of claim 1, wherein the sintering powder comprises from 0.1 to 15 wt % capping agent.

5. The sintering powder of claim 1, wherein the sintering powder comprises from 0.1 to 5 wt % capping agent.

6. The sintering powder of claim 1, wherein the sintering powder comprises about 0.5 wt % capping agent.

7. The sintering powder of claim 1 further comprising a layer of a third material, wherein the third material is different from the second material.

8. A method of manufacturing the sintering powder of claim 1, comprising:
   (i) providing a solution comprising a reducing agent and particles containing a first material comprising copper;
   (ii) reducing the concentration of the reducing agent in the solution from step (i);
   (iii) contacting the solution from step (ii) with a source of a second material comprising silver, to at least partially coat at least some of the particles containing a first material with a layer of the second material, the second material having a lower oxidation potential than the first material; and
   (iv) recovering at least some of the particles containing the first material coated with the second material from the solution of step (iii);
   wherein the particles comprise:
   a core comprising the first material comprising copper; and
   a shell at least partially coating the core, the shell comprising a layer of the second material comprising silver; and
   a capping agent at least partially coating the shell, the capping agent comprising octylamine;
   wherein the particles have a D50 of from 1 to 30 nm.

9. The method of claim 8, wherein step (i) comprises:
   providing a solution comprising a source of first material; and
   contacting the solution with a reducing agent.

10. The method of any of claim 8, wherein the reducing agent comprises hydrazine and/or borohydride.

11. The method of claim 10, wherein:
    the reducing agent comprises hydrazine; and
    step (ii) comprises contacting the reducing agent with acetone under basic conditions.

12. The method of claim 8, wherein:
    the first material comprises copper;
    the second material comprises silver; and
    the weight ratio of silver to copper in step (iii) is from 40:60 to 85:15.

13. The method of claim 8, wherein the solution of step (i) comprises capping agent.

14. The method of claim 8, wherein step (iv) comprises filtration and/or centrifugation.

15. A method of manufacturing a sintering powder comprising copper-containing nanoparticles coated with a layer comprising silver, the method comprising:
   (i) providing a solution comprising a hydrazine reducing agent, a capping agent, and copper-containing nanoparticles;
   (ii) contacting the solution from step (i) with hydroxide ions and acetone to reduce the concentration of the hydrazine reducing agent in the solution;
   (iii) contacting the solution from step (ii) with a silver salt to at least partially coat at least some of the copper-containing nanoparticles with a layer comprising silver; and
   (iv) recovering at least some of the copper-containing nanoparticles coated with the layer comprising silver from the solution of step (iii);
   wherein the particles comprise:
   a core comprising the first material comprising copper; and
   a shell at least partially coating the core, the shell comprising a layer of the second material comprising silver; and
   a capping agent at least partially coating the shell, the capping agent comprising octylamine;
   wherein the particles have a D50 of from 1 to 30 nm.

* * * * *